US012593473B2

(12) United States Patent
Huang et al.

(10) Patent No.: US 12,593,473 B2
(45) Date of Patent: Mar. 31, 2026

(54) THIN FILM TRANSISTOR, MANUFACTURING METHOD THEREOF, ARRAY SUBSTRATE AND DISPLAY PANEL

(71) Applicant: BOE TECHNOLOGY GROUP CO., LTD., Beijing (CN)

(72) Inventors: Jie Huang, Beijing (CN); Ce Ning, Beijing (CN); Zhengliang Li, Beijing (CN); Hehe Hu, Beijing (CN); Jiayu He, Beijing (CN); Nianqi Yao, Beijing (CN); Kun Zhao, Beijing (CN); Feifei Li, Beijing (CN); Liping Lei, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 633 days.

(21) Appl. No.: 17/919,301

(22) PCT Filed: Nov. 29, 2021

(86) PCT No.: PCT/CN2021/133997
§ 371 (c)(1),
(2) Date: Oct. 17, 2022

(87) PCT Pub. No.: WO2023/092554
PCT Pub. Date: Jun. 1, 2023

(65) Prior Publication Data
US 2024/0297255 A1    Sep. 5, 2024

(51) Int. Cl.
H10D 86/60        (2025.01)
H10D 30/67        (2025.01)
(Continued)

(52) U.S. Cl.
CPC ....... H10D 30/6755 (2025.01); H10D 86/423 (2025.01); H10D 86/60 (2025.01); H10D 99/00 (2025.01)

(58) Field of Classification Search
CPC .... H10D 30/6755; H10D 99/00; H10D 86/60; H10D 86/423
See application file for complete search history.

(56) References Cited

U.S. PATENT DOCUMENTS 9,559,215 B1 * 1/2017 Ahmed ............. H01L 21/02631
2009/0057674 A1 * 3/2009 Jeong ................. H10D 30/6755
257/E33.001
(Continued)

FOREIGN PATENT DOCUMENTS

CN        105140271 A    12/2015
CN        110993610 A    4/2020
(Continued)

*Primary Examiner* — Jeff W Natalini
*Assistant Examiner* — Ian Isaac Degrasse
(74) *Attorney, Agent, or Firm* — HOUTTEMAN LAW LLC

(57) ABSTRACT

The present disclosure provides a thin film transistor, a method for manufacturing the thin film transistor, an array substrate and a display panel. The thin film transistor includes: a substrate; and a gate electrode, a gate insulating layer, an active layer, a source electrode and a drain electrode on the substrate, wherein the active layer includes a first semiconductor layer and a second semiconductor layer sequentially arranged in a direction perpendicular to the substrate, the second semiconductor layer is arranged on a side of the first semiconductor layer away from the gate electrode; an absolute value of a difference between conduction band minimums of a first oxide material and a second oxide material is greater than 0.2 eV.

16 Claims, 7 Drawing Sheets

(51) Int. Cl.
    *H10D 86/40*         (2025.01)
    *H10D 99/00*         (2025.01)

(56) References Cited

U.S. PATENT DOCUMENTS

| | | | |
|---|---|---|---|
| 2013/0037808 A1 | 2/2013 | Kishida et al. | |
| 2015/0263052 A1* | 9/2015 | Yamazaki | H10F 39/80377 |
| | | | 257/43 |
| 2015/0364610 A1* | 12/2015 | Tsubuku | H01L 21/02554 |
| | | | 257/43 |
| 2016/0260837 A1* | 9/2016 | Koezuka | H10D 99/00 |
| 2017/0170330 A1 | 6/2017 | Li | |
| 2019/0123300 A1* | 4/2019 | Kanegae | H10D 30/6706 |
| 2019/0280018 A1* | 9/2019 | Song | H10D 86/40 |

FOREIGN PATENT DOCUMENTS

| | | | |
|---|---|---|---|
| CN | 112864254 A | | 5/2021 |
| CN | 113013189 A | | 6/2021 |
| JP | 2013225551 A | * | 10/2013 |
| WO | WO 2011162177 A1 | | 12/2011 |
| WO | WO 2018011648 A1 | | 1/2018 |

* cited by examiner

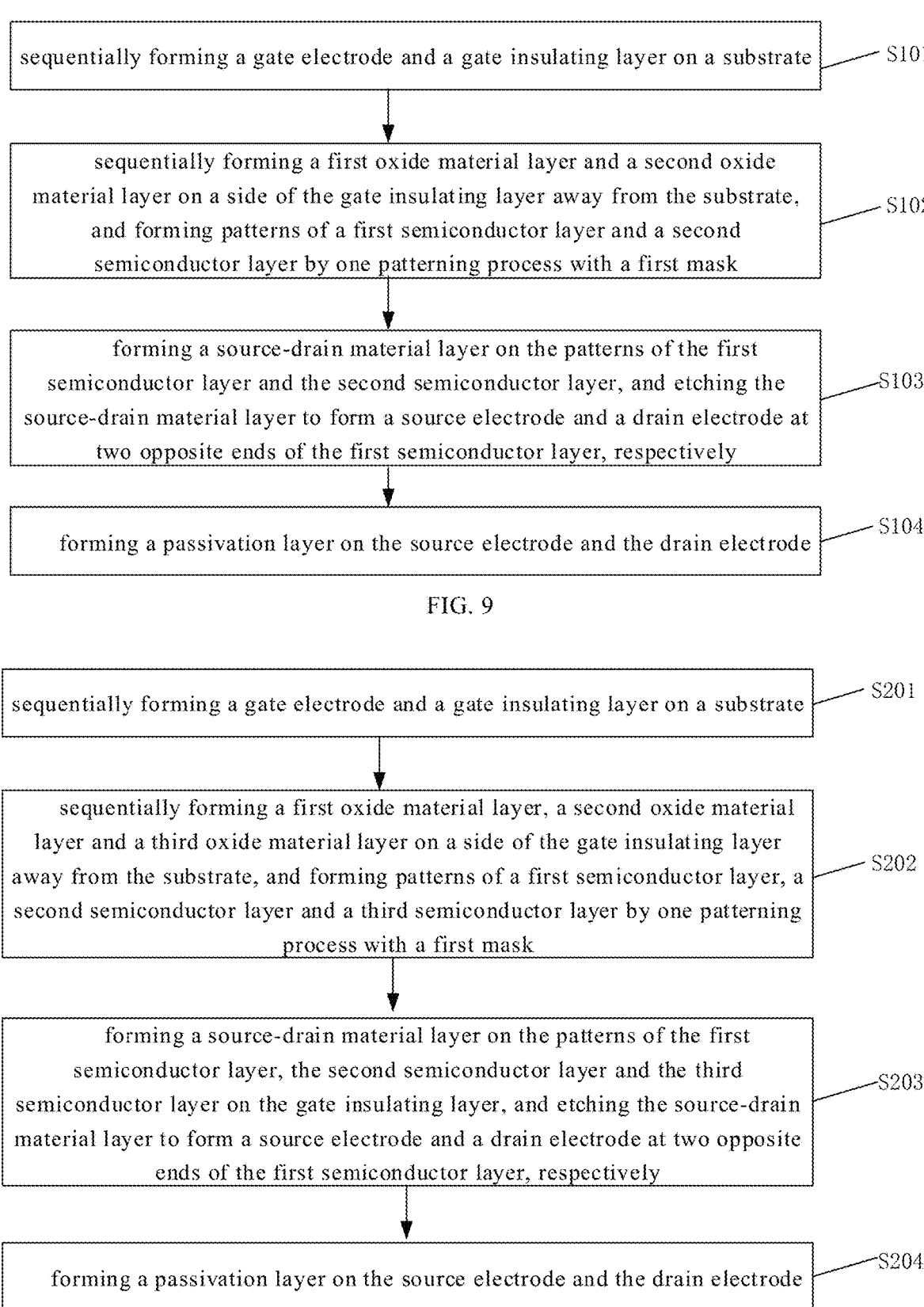

sequentially forming a gate electrode and a gate insulating layer on a substrate — S101 sequentially forming a first oxide material layer and a second oxide material layer on a side of the gate insulating layer away from the substrate, and forming patterns of a first semiconductor layer and a second semiconductor layer by one patterning process with a first mask — S102 forming a source-drain material layer on the patterns of the first semiconductor layer and the second semiconductor layer, and etching the source-drain material layer to form a source electrode and a drain electrode at two opposite ends of the first semiconductor layer, respectively — S103 forming a passivation layer on the source electrode and the drain electrode — S104

FIG. 9 sequentially forming a gate electrode and a gate insulating layer on a substrate — S201 sequentially forming a first oxide material layer, a second oxide material layer and a third oxide material layer on a side of the gate insulating layer away from the substrate, and forming patterns of a first semiconductor layer, a second semiconductor layer and a third semiconductor layer by one patterning process with a first mask — S202 forming a source-drain material layer on the patterns of the first semiconductor layer, the second semiconductor layer and the third semiconductor layer on the gate insulating layer, and etching the source-drain material layer to form a source electrode and a drain electrode at two opposite ends of the first semiconductor layer, respectively — S203 forming a passivation layer on the source electrode and the drain electrode — S204

FIG. 10

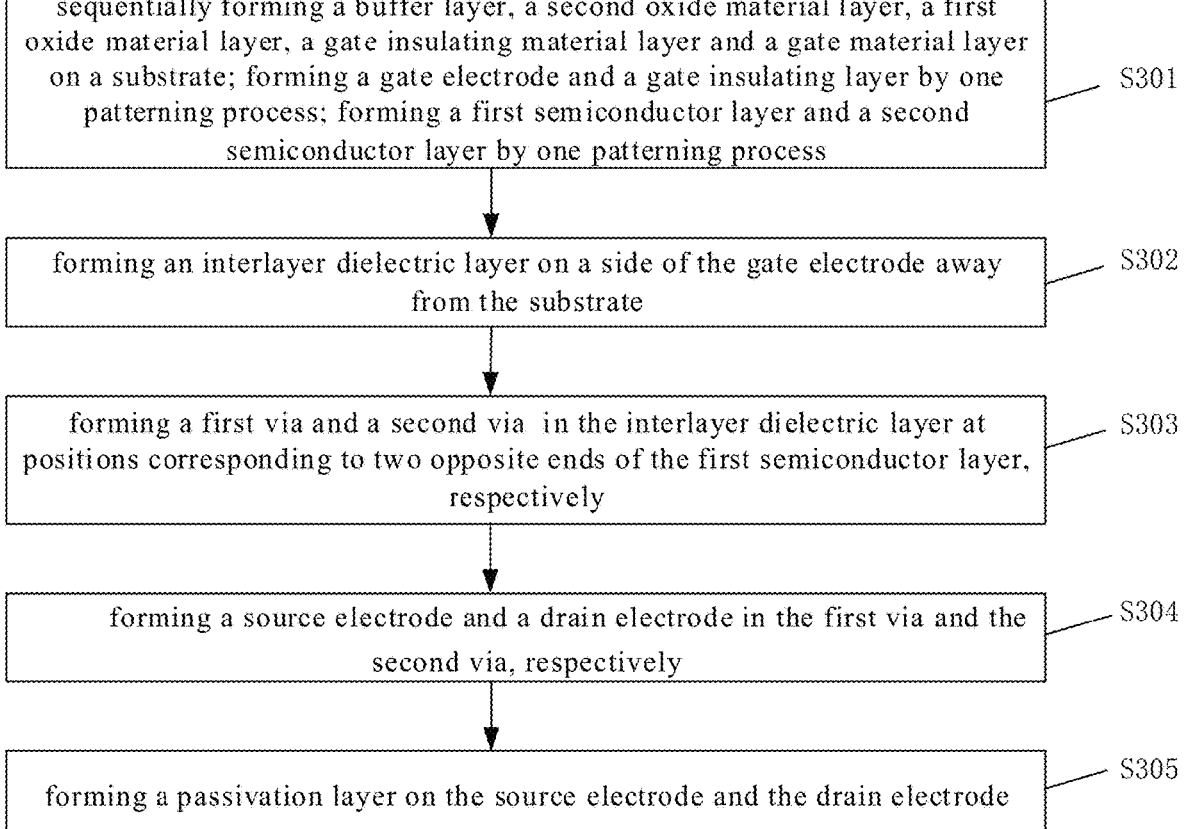

sequentially forming a buffer layer, a second oxide material layer, a first oxide material layer, a gate insulating material layer and a gate material layer on a substrate; forming a gate electrode and a gate insulating layer by one patterning process; forming a first semiconductor layer and a second semiconductor layer by one patterning process — S301 forming an interlayer dielectric layer on a side of the gate electrode away from the substrate — S302 forming a first via and a second via in the interlayer dielectric layer at positions corresponding to two opposite ends of the first semiconductor layer, respectively — S303 forming a source electrode and a drain electrode in the first via and the second via, respectively — S304 forming a passivation layer on the source electrode and the drain electrode — S305

FIG. 11

THIN FILM TRANSISTOR, MANUFACTURING METHOD THEREOF, ARRAY SUBSTRATE AND DISPLAY PANEL

TECHNICAL FIELD

The present disclosure relates to the field of display technology, and in particular to a thin film transistor, a manufacturing method thereof, an array substrate and a display panel.

BACKGROUND

With the development of an oxide thin film transistor (an oxide TFT) to have a higher mobility, stability of the device is gradually reduced. The stability of the device cannot be maintained to be acceptable when the device is developing to have a high display performance such as high resolution, high refresh rate, low power consumption, narrow frame and the like. For example, in a case where the TFT is subjected to a high voltage or a high current, the characteristics of the TFT are easily caused to be shifted and an output of a GOA is easily caused to be abnormal.

SUMMARY

The present disclosure provides a thin film transistor, a manufacturing method thereof, an array substrate and a display panel.

In a first aspect of the present disclosure, there is provided a thin film transistor, including: a substrate; and a gate electrode, a gate insulating layer, an active layer, a source electrode and a drain electrode on the substrate, wherein the active layer includes a first semiconductor layer and a second semiconductor layer sequentially arranged in a direction perpendicular to the substrate, the second semiconductor layer is arranged on a side of the first semiconductor layer away from the gate electrode; the first semiconductor layer includes a first oxide material, and the second semiconductor layer includes a second oxide material; the first oxide material has an electron mobility higher than that of the second oxide material; and the first oxide material has a conduction band minimum lower than that of the second oxide material, and an absolute value of a difference between the conduction band minimum of the first oxide material and the conduction band minimum of the second oxide material is greater than 0.2 eV.

In one embodiment, the active layer further includes a third semiconductor layer on a side of the second semiconductor layer away from the gate electrode, and the third semiconductor layer includes a crystalline oxide material.

In one embodiment, the crystalline oxide material includes crystalline IGZO.

In one embodiment, the active layer further includes a fourth semiconductor layer on a side of the first semiconductor layer close to the gate electrode; the fourth semiconductor layer includes a fourth oxide material; and the fourth oxide material has an electron mobility less than that of the first oxide material.

In one embodiment, the fourth oxide material is the same as the second oxide material.

In one embodiment, the first oxide material includes at least one of IGZO, IZO, IGTO, ITZO, and IGZTO; and the second oxide material includes at least one of GZO and Pr-GZO.

In one embodiment, the gate insulating layer is on a side of the gate electrode away from the substrate; the active layer is on a side of the gate insulating layer away from the substrate; areas of orthographic projection of the first semiconductor layer and the second semiconductor layer on the substrate are substantially the same; and the source electrode and the drain electrode are in contact with two opposite ends of each of the first semiconductor layer and the second semiconductor layer on the gate insulating layer, respectively.

In one embodiment, the thin film transistor further includes a buffer layer and an interlayer dielectric layer on the substrate, wherein the second semiconductor layer is on a side of the buffer layer away from the substrate; the first semiconductor layer is on a side of the second semiconductor layer away from the substrate; the gate insulating layer is on a side of the first semiconductor layer away from the substrate; the gate electrode is on a side of the gate insulating layer away from the substrate; the interlayer dielectric layer is on a side of the gate electrode away from the substrate; areas of orthographic projection of the first semiconductor layer and the second semiconductor layer on the substrate are substantially the same; and the source electrode and the drain electrode are in contact with two opposite ends of the first semiconductor layer through a first via and a second via in the interlayer dielectric layer, respectively.

In a second aspect of the present disclosure, there is provided a method for manufacturing a thin film transistor, including: forming a gate electrode, a gate insulating layer, an active layer, a source electrode and a drain electrode on a substrate, wherein the active layer includes a first semiconductor layer and a second semiconductor layer sequentially arranged in a direction perpendicular to the substrate, the second semiconductor layer is arranged on a side of the first semiconductor layer away from the gate electrode; the first semiconductor layer includes a first oxide material, and the second semiconductor layer includes a second oxide material; the first oxide material has an electron mobility higher than that of the second oxide material; and the first oxide material has a conduction band minimum lower than that of the second oxide material, and an absolute value of a difference between the conduction band minimum of the first oxide material and the conduction band minimum of the second oxide material is greater than 0.2 eV.

In one embodiment, the first oxide material includes at least one of IGZO, ITZO, IZO, IGTO, and IGZTO; and the second oxide material includes at least one of GZO and Pr-GZO.

In one embodiment, the forming a gate electrode, a gate insulating layer, an active layer, a source electrode and a drain electrode on a substrate, includes: forming a pattern of the gate electrode on the substrate; forming the gate insulating layer on the pattern of the gate electrode; sequentially forming a first oxide material layer and a second oxide material layer on the gate insulating layer, and forming patterns of the first semiconductor layer and the second semiconductor layer on the gate insulating layer through a single patterning process by using a first mask; forming a source-drain material layer on the patterns of the first semiconductor layer and the second semiconductor layer on the gate insulating layer, and etching the source-drain material layer to form the source electrode and the drain electrode at two opposite ends of the first semiconductor layer, respectively; and forming a passivation layer on the source electrode and the drain electrode.

In one embodiment, the forming a gate electrode, a gate insulating layer, an active layer, a source electrode and a drain electrode on a substrate, includes: forming a pattern of the gate electrode on the substrate; forming the gate insulating layer on the pattern of the gate electrode; sequentially forming a first oxide material layer, a second oxide material layer and a third oxide material layer on the gate insulating layer, and forming patterns of the first semiconductor layer, the second semiconductor layer and a third semiconductor layer on the gate insulating layer through a single patterning process by using a first mask; forming a source-drain material layer on the patterns of the first semiconductor layer, the second semiconductor layer and the third semiconductor layer on the gate insulating layer, and etching the source-drain material layer to form the source electrode and the drain electrode at two opposite ends of the first semiconductor layer, respectively; and forming a passivation layer on the source electrode and the drain electrode.

In one embodiment, the third semiconductor layer includes a crystalline oxide material.

In one embodiment, the forming a gate electrode, a gate insulating layer, an active layer, a source electrode and a drain electrode on a substrate, includes: forming a pattern of the gate electrode on the substrate; forming a gate insulating layer on the pattern of the gate electrode; sequentially forming a fourth oxide material layer, a first oxide material layer and a second oxide material layer on the gate insulating layer, and forming patterns of a fourth semiconductor layer, the first semiconductor layer and the second semiconductor layer on the gate insulating layer through a single patterning process by using a first mask; forming a source-drain material layer on the patterns of the fourth semiconductor layer, the first semiconductor layer and the second semiconductor layer on the gate insulating layer, and etching the source-drain material layer to form the source electrode and the drain electrode at two opposite ends of the first semiconductor layer, respectively; and forming a passivation layer on the source electrode and the drain electrode.

In one embodiment, the forming a gate electrode, a gate insulating layer, an active layer, a source electrode and a drain electrode on a substrate, includes: sequentially forming a buffer layer, a second oxide material layer, a first oxide material layer, the gate insulating material layer and a gate material layer on the substrate; forming patterns of the gate electrode and the gate insulating layer through a single patterning process by using a first mask; forming patterns of the first semiconductor layer and the second semiconductor layer through a single patterning process by using a second mask; forming an interlayer dielectric layer on a side of the gate electrode away from the substrate; forming a first via and a second via at positions corresponding to two opposite ends of the first semiconductor layer in the interlayer dielectric layer, respectively; filling a source material and a drain material in the first via and the second via, respectively, to form the source electrode and the drain electrode; and forming a passivation layer on the source electrode and the drain electrode.

The present disclosure also provides an array substrate, which includes a light emitting device and a driving circuit for driving the light emitting device to emit light, wherein the driving circuit includes the thin film transistor.

The present disclosure also provides a display panel including the above array substrate.

BRIEF DESCRIPTION OF DRAWINGS

The accompanying drawings, which are provided for further understanding of the technical solution of the present disclosure and constitute a part of this specification, are for explaining the technical solution of the present disclosure together with the embodiments of the present disclosure, but are not intended to limit the technical solution of the present disclosure.

FIG. 9 shows a flow chart of a method for manufacturing a thin film transistor according to an embodiment of the present disclosure;

FIG. 10 shows a flow chart of a method for manufacturing a thin film transistor according to an embodiment of the present disclosure; and FIG. 11 shows a flow chart of a method for manufacturing a thin film transistor according to an embodiment of the present disclosure.

DETAIL DESCRIPTION OF EMBODIMENTS

Figure 1A:
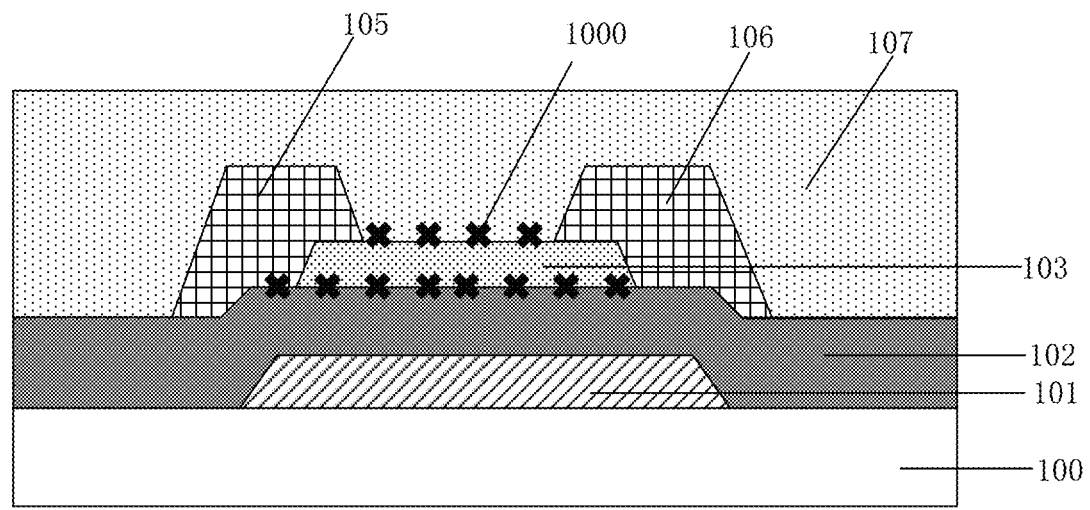
FIGS. 1A and 1B each show a schematic diagram of a structure of a thin film transistor in the related art.

Some embodiments are described herein, but are exemplary rather than limiting. It will be apparent to a person skilled in the art that more embodiments and implementations are possible within the scope of the embodiments described herein. Although many possible combinations of features are shown in the drawings and discussed in the detailed description, many other combinations of the disclosed features are possible. Any feature or element of any embodiment may be used in combination with, or instead of, any other feature or element in any other embodiment, unless explicitly limited otherwise.

Further, when describing the representative embodiments, a method and/or a procedure may be presented as a particular sequence of steps in the description. However, to the extent that the method or procedure does not rely on the particular sequence of steps set forth herein, the method or procedure should not be limited to the particular sequence of steps described. Other sequences of steps are possible as will be appreciated by a person skilled in the art. Therefore, the particular sequence of steps set forth in the specification should not be construed as limiting the claims. Furthermore, the claims directed to the method and/or procedure should not be limited to performing the steps in the sequence and it may be readily appreciated by a person skilled in the art that the sequence may be changed, which still remains within the spirit and scope of the embodiments of the present application.

Unless defined otherwise, technical or scientific terms used in the present disclosure of the embodiments of the present application should have the ordinary meaning as understood by a person skilled in the art to which the present application pertains. The terms "first", "second", and the like used in the embodiments of the present application are not intended to indicate any order, quantity, or importance, but rather are used for distinguishing one element from another. The term of "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly. The objects described may or may not be in direct contact with each other.

An active layer of an oxide thin film transistor in the related art is usually made of a single-layer high-mobility oxide material (a single layer of oxide material having a high mobility), such as a single-layer Indium Gallium Zinc Oxide (IGZO). A source-drain (S/D) etching liquid is used in such the structure when a source-drain (S/D) electrode is formed by wet etching. A following situation exists: a side (called a back channel) of a channel away from a substrate and close to a source-drain layer is eroded by the S/D etching liquid. For example, as shown in FIG. 1A, the thin film transistor in the related art may include a substrate 100; a gate electrode 101, a gate insulating layer 102, an active layer 103, a source electrode 105, a drain electrode 106, and a passivation layer 107 covering the source electrode 105 and the drain electrode 106, which are sequentially formed on the substrate 100.

Figure 1B:
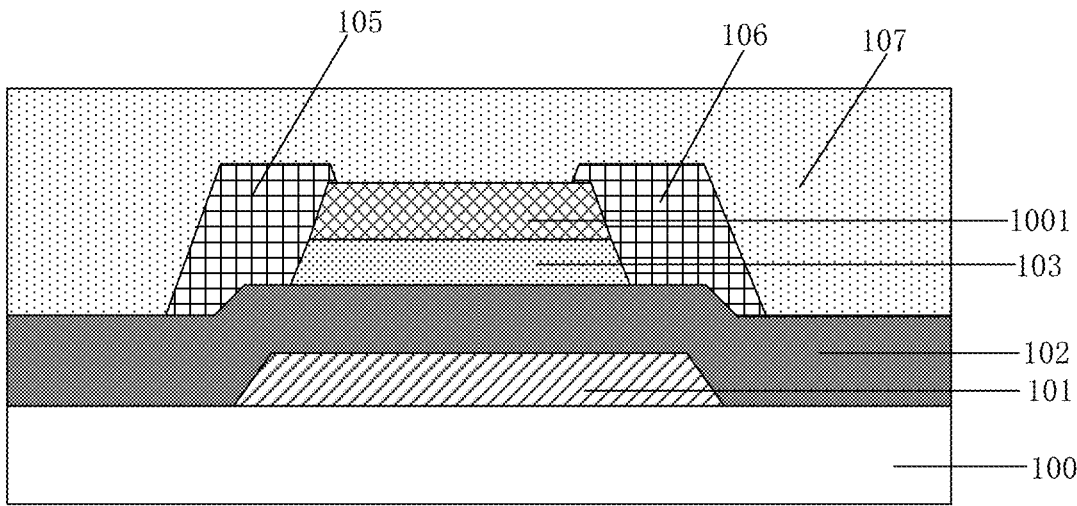

In the thin film transistor shown in FIG. 1A, a channel of the active layer 103 is actually in contact with the gate insulating layer 102 and the passivation layer 107. The S/D etching liquid may greatly damage the active layer 103 made of an oxide material, such as a single-layer IGZO, so that a large number of defects are formed in the back channel, which can significantly reduce the stability of the device and seriously affect the characteristics of the device. Actually, some interface defects may exist when the channel is in contact with the gate insulating layer or the passivation layer, which can also reduce the stability. In order to solve this problem, in the related art, an etch stop layer 1001 made of an oxide material is added on the active layer made of the single-layer oxide, as shown in FIG. 1B, which can improve the stability of the device without adding a mask process. However, in the related art, a crystalline oxide is generally used as the etch stop layer 1001 for protecting the channel. A difference between a conduction band minimum $E_{CBM}$ of the etch stop layer 1001 and a conduction band minimum $E_{CBM}$ of an actual material of the channel is small, is usually within 0.2 eV, so that a certain amount of carriers 1000 inside the channel still migrate to the back channel, that is, migrate to a side of the etch stop layer away from the semiconductor layer, and thus, are captured by the defects in the back channel, thereby reducing the stability.

In the present application, a conduction band is an energy space formed by free electrons, that is, an energy range of electrons moving freely in a solid structure; the sign CBM denotes a conduction band minimum (CBM); $E_{CBM}$ represents an energy value between the conduction band minimum and a vacuum energy level Evac, wherein the vacuum energy level Evac is 0 eV; the most important energy bands of a semiconductor layer are a valence band maximum (VBM) and the conduction band minimum (CBM). A band gap (energy gap) is obtained by subtracting VBM from CBM.

In the related art, the etch stop layer 1001 may be formed by using a crystalline IGZO material (e.g., IGZO (136) with an atomic ratio of In:Ga:Zn being 1:3:6), and an energy difference between the $E_{CBM}$ of the material and the vacuum energy level Evac is 4.3 eV. For example, the semiconductor layer (i.e., a channel layer) of the thin film transistor may be formed by using an amorphous IGZO material (e.g., IGZO (111) with an atomic ratio of In:Ga:Zn being 1:1:1), and an energy difference between the $E_{CBM}$ of the material and the vacuum energy level Evac is 4.48 eV. In this way, a difference between the $E_{CBM}$ values of the etch stop layer and the semiconductor layer is less than 0.2 eV, so that it is easy to form a large amount of back channel defects at the back channel of the active layer during forming a source-drain pattern, causing a large amount of carriers 1000 to be captured at the defects during the operation of the device, which reduces the stability of the device.

That is, in the related art, an absolute value of the energy level difference between the conduction band minimums of both a first material Oxide1 (e.g., IGZO (111)) forming a first semiconductor layer of the active layer and a second material Oxide2 (e.g., IGZO (136)) forming a second semiconductor layer of the active layer is less than 0.2 eV, i.e., $|E_{CBM}Oxide1-E_{CBM}Oxide2|<0.2$ eV. For example, Oxide1 is IGZO (111), Oxide2 is IGZO (136), and the difference between their conduction band minimums is within 0.2 eV, which cannot effectively prevent the migration of electrons.

In order to solve the technical problem, embodiments of the present application provide a thin film transistor and a method for manufacturing the same.

Figure 2:
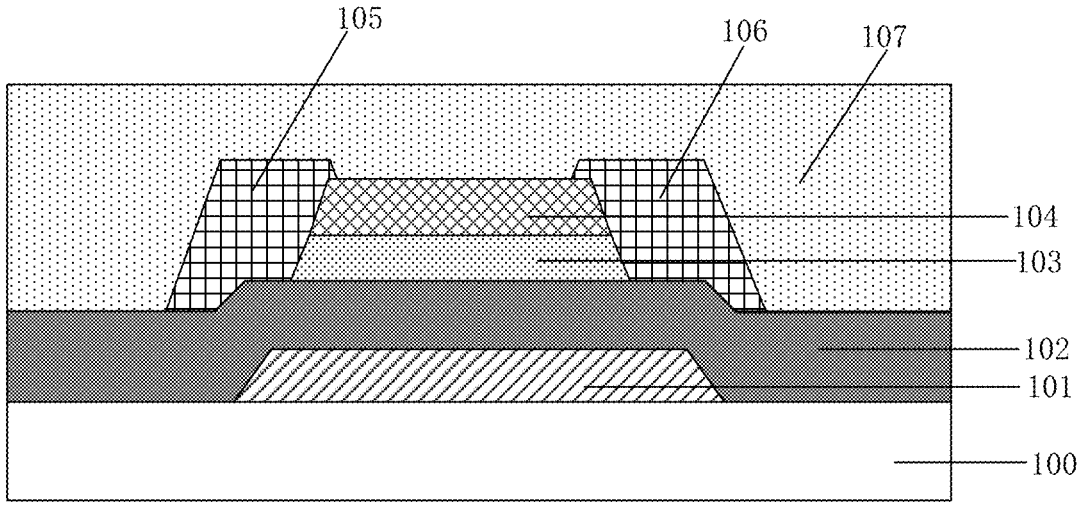
FIG. 2 shows a schematic diagram of a structure of a thin film transistor according to an embodiment of the present disclosure.

As shown in FIG. 2, the thin film transistor of the present disclosure includes a substrate 100 made of, for example, glass; and a gate electrode 101, a gate insulating layer 102, an active layer including a first semiconductor layer 103 and a second semiconductor layer 104, a source electrode 105, a drain electrode 106, and a passivation layer 107, which are sequentially formed on the substrate 100.

As shown in FIG. 2, the first semiconductor layer 103 and the second semiconductor layer 104 of the thin film transistor of the present disclosure are stacked on each other, forming the active layer. The first semiconductor layer 103, as a portion of the active layer mainly for forming a channel, is generally made of an oxide material having a high mobility, and is provided between the gate insulating layer 102 and the second semiconductor layer 104. For example, the first semiconductor layer 103 may be formed by using a metal oxide material having a conduction band minimum $E_{CBM}$ in a range from 4.4 eV to 5.2 eV, a band gap Eg in a range from 2.0 eV to 3.2 eV, and a carrier concentration in an order of 5*E19. The second semiconductor layer 104 is provided on a side of the first semiconductor layer 103 away from the gate electrode 101. In the thin film transistor of the present embodiment, as described above, it is desirable that carriers are in the first semiconductor layer 103 so that the carriers are transmitted between the source electrode 105 and the drain electrode 106 by using the first semiconductor layer 103 as a channel layer when the thin film transistor operates; while a main function of the second semiconductor layer 104 includes interface matching and etch protection, thus acting as an etch stop layer.

Specifically, in the present disclosure, an absolute value of a difference between a conduction band minimum of the first material of the first semiconductor layer 103 and a conduction band minimum of the second material of the second semiconductor layer 104 is greater than 0.2 eV.

In one embodiment, the first semiconductor layer 103 and the second semiconductor layer 104 are both oxide semiconductor layers. The first oxide material Oxide1 of the first semiconductor layer 103 and the second oxide material Oxide2 of the second semiconductor layer 104 should satisfy an absolute value of $(E_{CBM}Oxide1-E_{CBM}Oxide2)$ is greater than 0.2 eV, and the absolute value further may be greater than 0.3 eV.

The material of the first semiconductor layer 103 may be IGZO, which is a material of a semiconductor layer in the related art; and the material of the second semiconductor layer 104 may be GZO, which mainly functions as the etch stop layer. In this case, it is ensured that the absolute value of $(E_{CBM}Oxide1-E_{CBM}Oxide2)$ is greater than 0.4 eV, so that most of carriers in the first semiconductor layer 103 are blocked and cannot migrate to the back channel and thus, cannot be captured by the back channel, thereby improving the stability of the thin film transistor.

Specifically, the material of the first semiconductor layer 103 may include at least one of IGZO, IZO, IGTO, ITZO, and IGZTO, which all have a higher electron mobility; the material of the second semiconductor layer 104 may include at least one of GZO and Pr-GZO (where GZO is doped with a certain amount of Pr (praseodymium element)), which all have a higher conduction band minimum. Specifically, the conduction band minimums $E_{CBM}$ of these materials are as follows: IGZO (111)=4.48 eV; IZO (31) (an atomic ratio of In:Zn being 3:1)=5.2 eV; IZO (11) (an atomic ratio of In:Zn being 1:1)=4.9 eV; GZO (73) (an atomic ratio of Ga:Zn being 7:3)=4.05 eV; GZO (37) (an atomic ratio of Ga:Zn being 3:7)=4.08 eV.

In the embodiment, patterns of the first semiconductor layer 103 and the second semiconductor layer 104 may be simultaneously formed through a single patterning process. For example, a first oxide material layer and a second oxide material layer may be sequentially formed on the substrate 100, and then, the patterns of the first semiconductor layer 103 and the second semiconductor layer 104 may be simultaneously formed by using a same mask through a single patterning process (including coating photoresist, exposure, development, and etching). In this way, orthographic projections of the patterns of the first semiconductor layer 103 and the second semiconductor layer 104 on the substrate 100 substantially completely overlap each other.

Figure 3:
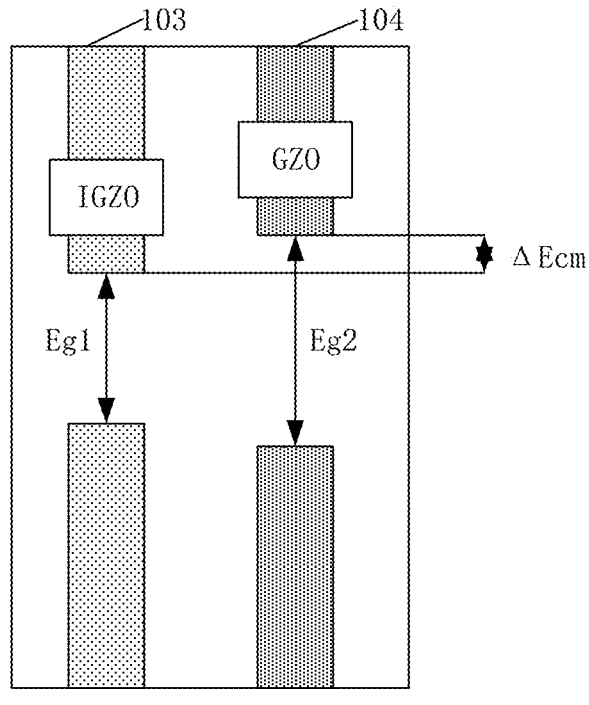
FIG. 3 shows a schematic diagram illustrating energy levels of a first semiconductor layer and a second semiconductor layer of the thin film transistor in FIG. 2.

FIG. 3 shows a relationship of energy levels of the first semiconductor layer 103 made of IGZO and the second semiconductor layer 104 made of GZO in the thin film transistor. The first semiconductor layer 103 of IGZO has a band gap Eg1 of, for example, 3 eV; the second semiconductor layer 104 of GZO has a band gap Eg2 of, for example, 4.03 eV; a conduction band minimum of the first semiconductor layer 103 of IGZO is less than that of the second semiconductor layer 104 of GZO, and an absolute value of a difference between the conduction band minimums is ΔEcm. When the first semiconductor layer 103 employs amorphous IGZO (e.g., IGZO (111)) and the second semiconductor layer 104 employs GZO, the absolute value of ΔEcm therebetween is about 0.43 eV, i.e., $|E_{CBM}IGZO-E_{CBM}GZO|\approx0.43$ eV.

In the related art, the active layer of the thin film transistor includes an amorphous IGZO (e.g., IGZO (111)) and a crystalline IGZO (e.g., IGZO (136)); and a difference between the conduction band minimums of the amorphous IGZO (e.g., IGZO (111)) and the crystalline IGZO (e.g., IGZO (136)) is within 0.2 eV, which cannot effectively block the migration of electrons. Compared with the related art, in the present disclosure, the crystalline IGZO, as used in the related art, is removed from the active layer of the thin film transistor, and a material having a higher conduction band, such as GZO, is adopted as the etch stop layer and is arranged on a side of the first semiconductor layer 103 away from the gate electrode 101, wherein $|E_{CBM}Oxide1-E_{CBM}Oxide2|>0.3$ eV. In this case, most of carriers in a bottom channel can be blocked, and thus, cannot migrate to the back channel, and further cannot be captured by the back channel defects, so that the stability of the TFT is improved.

Figure 4:
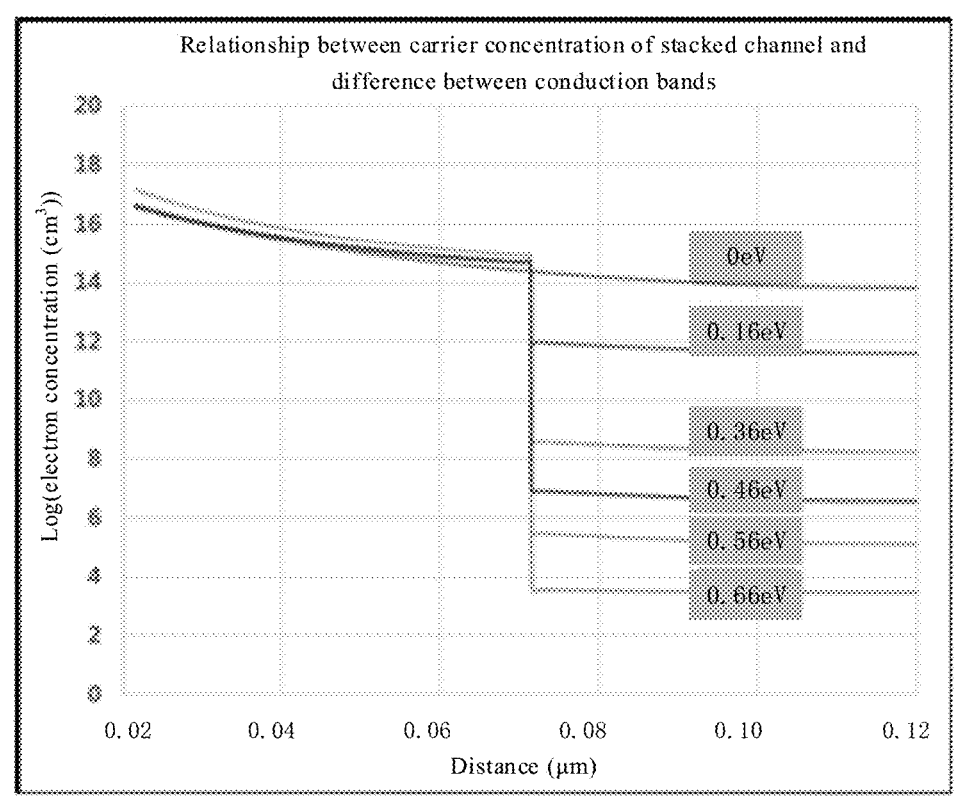
FIG. 4 shows a relationship between a carrier concentration of a stacked channel formed by a first semiconductor layer and a second semiconductor layer and an energy level difference between conduction bands of a first material of the first semiconductor layer and a second material of the second semiconductor layer.
Figure 5:
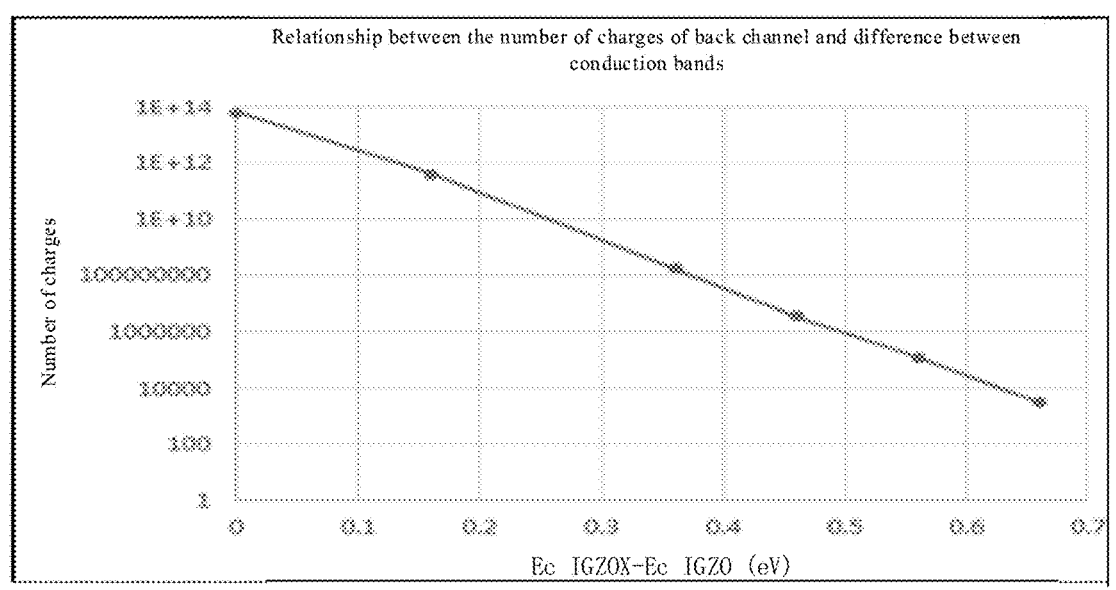
FIG. 5 shows a relationship between the number of charges in a back channel and an energy level difference between conduction bands of a first material of a first semiconductor layer and a second material of a second semiconductor layer.

FIGS. 4 and 5 show a simulated relationship between a carrier concentration of a channel and an energy level difference (for short, a conduction band difference) between conduction band minimums of materials of the first semiconductor layer and of the second semiconductor layer; a relationship between the number of charges in a back channel and an energy level difference between conduction band minimums of materials of the first semiconductor layer and of the second semiconductor layer, respectively.

Specifically, FIG. 4 shows a simulation diagram of carrier concentrations at respective positions in the active layer as a stacked channel, in which a horizontal axis represents a distance of the active layer from the gate insulating layer 102 and a vertical coordinate represents magnitude of carrier concentration. When the stacked channel is an N-type channel, the carriers are electrons. The conduction band minimum $E_{CBM}$ of the second oxide material Oxide2 of the second semiconductor layer 104 is much greater than that of the first oxide material Oxide1 of the first semiconductor layer 103, so that carriers in the first oxide material Oxide1 may migrate by overcoming a greater potential energy between the first oxide material Oxide1 and the second oxide material Oxide2, which increases the difficulty of the carriers migrating to the second oxide material Oxide2. As shown in FIG. 5, when an absolute value of $(E_{CBM}Oxide1-E_{CBM}Oxide2)$ is less than 0.2 eV (i.e., $|E_{CBM}Oxide1-E_{CBM}Oxide2|<0.2$ eV), the carrier concentration in the back channel is about in an order of $1.0E11/cm^3$, and thus the stability is reduced by carriers in the back channel in such an order. However, if the conduction band difference is further improved, for example, when $|E_{CBM}Oxide1-E_{CBM}Oxide2|>0.3$ eV, the carrier concentration in the back channel is reduced to the order of $1.0E8/cm^3$; when $E_{CBM}Oxide1-E_{CBM}Oxide2|>0.4$ eV, the carrier concentration in the back channel is reduced to the order of $1.0E6/cm^3$. Compared with a carrier concentration in an order of $1.0E16/cm^3$ in a front channel (the first semiconductor layer 103), the carrier concentration in the back channel is reduced by 10 orders, so that the stability of the device is remarkably improved.

In the present disclosure, a carrier concentration in a normal operating state of the thin film transistor is a carrier concentration inside the first semiconductor layer. For example, the carrier concentration of the first semiconductor layer 103 is generally between $1\times E15/cm^3$ to $1\times E19/cm^3$. In the embodiment of the present disclosure, the absolute value of the difference between the conduction band minimums of the first oxide material Oxide1 of the first semiconductor layer 103 and the second oxide material Oxide2 of the second semiconductor layer 104 is set to 0.2 eV or more, so that the carrier concentration in the back channel may be reduced to be in a range from $1 \times E11/cm^3$ to $1 \times E1/cm^3$.

FIG. 5 illustrates an example where the first semiconductor layer 103 is made of amorphous IGZO (e.g., IGZO (111)) and the second semiconductor layer 104 is made of an oxide material (denoted as IGZOX). As can be seen from FIG. 5, the number of carriers in the back channel is in an order of $1*E11$ when the difference between the conduction bands of the materials of the first semiconductor layer and the second semiconductor layer is 0.2 eV; the number of carriers in the back channel is in an order of $1*E9$ when the difference between the conduction bands of the materials of the first semiconductor layer and the second semiconductor layer is 0.3 eV, that is, the number of carriers in the back channel is reduced by 2 orders; further, the number of carriers in the back channel is in an order of $1*E7$ when the difference between the conduction bands of the materials of the first semiconductor layer and the second semiconductor layer is 0.4 eV, that is, the number of carriers in the back channel is further reduced by 2 orders.

As can be seen from the above, in the thin film transistor of the present disclosure, when the difference between the conduction band minimum of the first oxide material Oxide1 of the first semiconductor layer 103 and the conduction band minimum of the second oxide material Oxide2 of the second semiconductor layer 104 is greater than 0.2 eV, the carrier concentration in the back channel is significantly reduced. By further increasing the difference between the conduction band minimum of the first oxide material Oxide1 of the first semiconductor layer 103 and the conduction band minimum of the second oxide material Oxide2 of the second semiconductor layer 104, the carrier concentration in the back channel can be further reduced, and thus the stability of the oxide thin film transistor can be significantly improved.

Figure 6A:
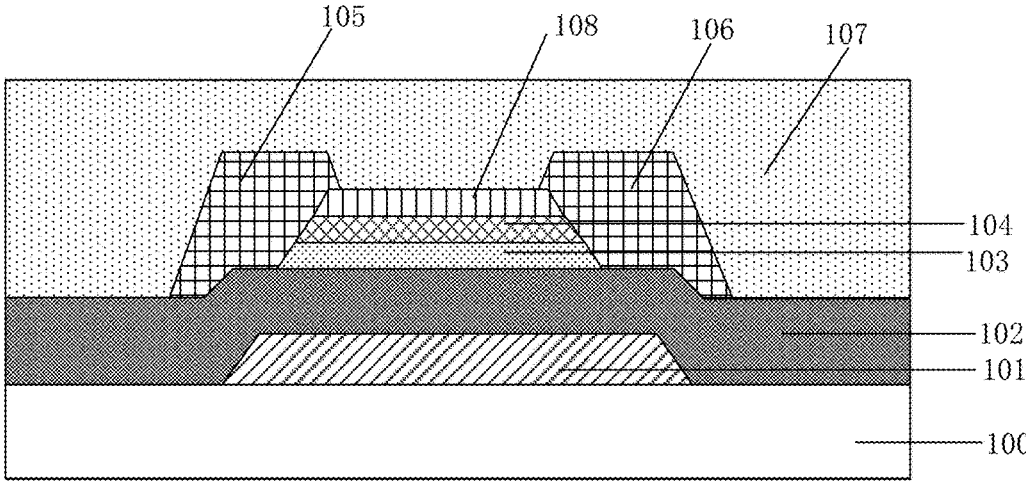
FIG. 6A shows a schematic diagram of a structure of a thin film transistor according to an embodiment of the present disclosure.

FIG. 6A shows a schematic diagram of a thin film transistor according to an embodiment of the present disclosure. The thin film transistor may include a substrate 100; and a gate electrode 101, a gate insulating layer 102, an active layer including a first semiconductor layer 103 and a second semiconductor layer 104, a source electrode 105, a drain electrode 106, and a passivation layer 107 sequentially formed on the substrate 100. In the embodiment, the active layer includes the first semiconductor layer 103, the second semiconductor layer 104, and a third semiconductor layer 108 sequentially stacked together. The second semiconductor layer 104 is disposed on a side of the first semiconductor layer 103 away from the gate electrode 101, and the third semiconductor layer 108 is disposed on a side of the second semiconductor layer 104 away from the gate electrode 101.

As in the embodiment shown in FIG. 2, in this embodiment, the first semiconductor layer 103, as a portion of the active layer mainly for forming a channel, is generally made of an oxide material having a higher mobility; the second semiconductor layer 104 is made of an oxide material having a higher conduction band minimum. For example, the first oxide material Oxide1 of the first semiconductor layer 103 is a conventional channel material such as IGZO, IGTO, IZO, ITZO, IGZTO, etc., and the second oxide material Oxide2 of the second semiconductor layer 104 is GZO, Pr-GZO, etc. Unlike the embodiment shown in FIG. 2, the active layer of the thin film transistor of the embodiment further includes the third semiconductor layer 108 disposed on the side of the second semiconductor layer 104, which mainly serves as an etch stop layer, away from the gate electrode 101. A material of the third semiconductor layer 108 may be a third oxide material Oxide3. For example, the third oxide material may be a crystalline oxide material, such as IGZO (136) or the like. In the embodiment, a relationship of the energy levels of the conduction band minimums $E_{CBM}$ of the first oxide material Oxide1, the second oxide material Oxide2 and the third oxide material Oxide3 of the active layer may be set as: $|E_{CBM}Oxide1 - E_{CBM}Oxide2| > 0.2$ eV; further, may be set as $|E_{CBM}Oxide1 - E_{CBM}Oxide2| > 0.3$ eV, to further improve the performance of the thin film transistor; a relationship of energy levels of the conduction band minimums of the second oxide material Oxide2 and the third oxide material Oxide3 may be set as: $|E_{CBM}Oxide3| > |E_{CBM}Oxide2|$ (i.e., an absolute value of the conduction band minimum of the third oxide material is greater than that of the conduction band minimum of the second oxide material).

In the thin film transistor of the embodiment shown in FIG. 6A, a crystalline oxide layer is further provided on a side of the active layer away from the gate electrode 101 to improve physical blocking characteristics for preventing H and O elements in adjacent layers or adjacent processes from affecting the semiconductor layer. With the design of the stacked channel, the stability of the oxide thin film transistor having a higher mobility can be significantly improved.

Figure 6B:
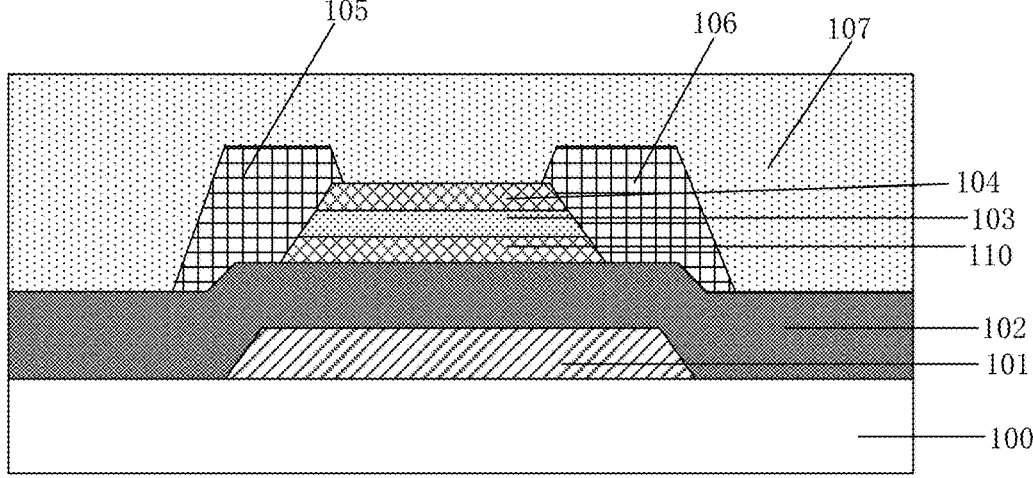
FIG. 6B shows a schematic diagram of a structure of a thin film transistor according to an embodiment of the present disclosure.

FIG. 6B shows a schematic diagram of a thin film transistor according to an embodiment of the present disclosure. The thin film transistor may include a substrate 100; and a gate electrode 101, a gate insulating layer 102, an active layer including a first semiconductor layer 103, a second semiconductor layer 104 and a fourth semiconductor layer 110, a source electrode 105, a drain electrode 106, and a passivation layer 107 sequentially formed on the substrate 100. In the embodiment, the active layer includes the fourth semiconductor layer 110, the first semiconductor layer 103, and the second semiconductor layer 104 sequentially stacked on the gate insulating layer 102. The second semiconductor layer 104 is disposed on a side of the first semiconductor layer 103 away from the gate electrode 101, and the fourth semiconductor layer 110 is disposed on a side of the first semiconductor layer 103 close to the gate electrode 101.

As in the embodiment shown in FIG. 2, in this embodiment, the first semiconductor layer 103, as a portion of the active layer mainly for forming a channel, is generally made of an oxide material having a higher mobility; the second semiconductor layer 104 is made of an oxide material having a higher conduction band minimum. For example, the first oxide material Oxide1 of the first semiconductor layer 103 is a conventional channel material such as IGZO, IGTO, IZO, ITZO, IGZTO, etc., and the second oxide material Oxide2 of the second semiconductor layer 104 is GZO, Pr-GZO, etc. Unlike the embodiment shown in FIG. 2, the active layer of the thin film transistor of the embodiment further includes the fourth semiconductor layer 110 disposed on the side of the first semiconductor layer 103 mainly serving as a carrier channel, which is close to the gate electrode 101. That is, in this embodiment, the active layer includes the second semiconductor layer 104 and the fourth semiconductor layer 110 disposed on both sides of the first semiconductor layer 103, respectively. A material of the fourth semiconductor layer 110 may be the same as that of the second semiconductor layer 104, i.e., the fourth semiconductor layer 110 may be made of the second oxide material Oxide2. For example, in the embodiment, a relationship of energy levels of the conduction band minimums $E_{CBM}$ of the first oxide material Oxide1 and the second oxide material Oxide2 of the active layer may be set as: $|E_{CBM}$Oxide1$-E_{CBM}$Oxide2$|>0.2$ eV; further, may be set as $|E_{CBM}$Oxide1$-E_{CBM}$Oxide2$|>0.3$ eV, to further improve the performance of the thin film transistor.

Figure 6C:
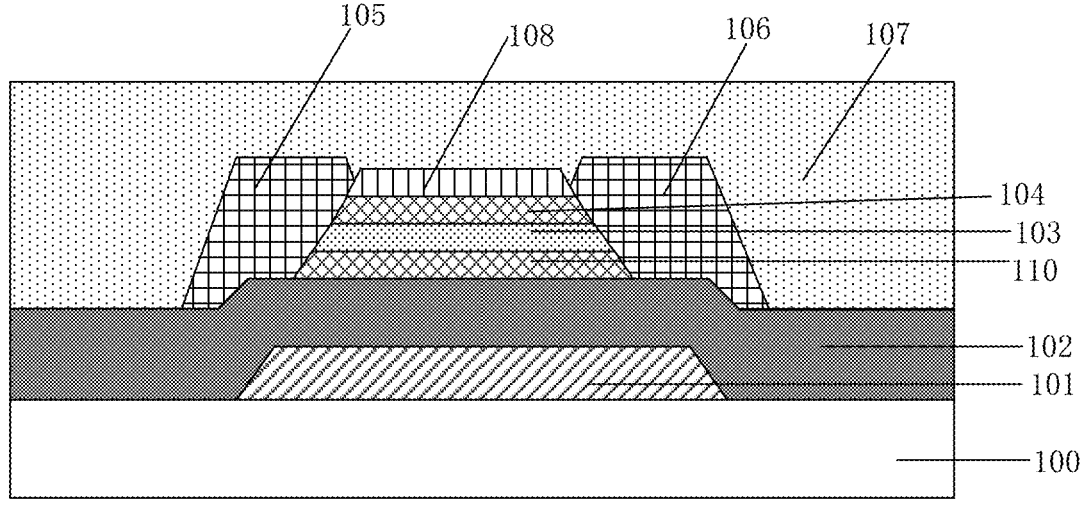
FIG. 6C shows a schematic diagram of a structure of a thin film transistor according to an embodiment of the present disclosure.

Similarly, in order to further improve the performance of the device, a third semiconductor layer 108 may be further disposed on the second semiconductor layer 104 of the active layer of the thin film transistor shown in FIG. 6B, as shown in FIG. 6C. As described above, in the embodiment, the material of the third semiconductor layer 108 may be the third oxide material Oxide3. For example, the third oxide material may be a crystalline oxide material, such as IGZO (136) or the like. In the embodiment, a relationship of the energy levels of the conduction band minimums $E_{CBM}$ of the first oxide material Oxide1, the second oxide material Oxide2 and the third oxide material Oxide3 of the active layer may be set as: $|E_{CBM}$Oxide1$-E_{CBM}$Oxide2$|>0.2$ eV; further, may be set as $|E_{CBM}$Oxide1$-E_{CBM}$Oxide2$|>0.3$ eV, to further improve the performance of the thin film transistor; a relationship of energy levels of the conduction band minimums of the second oxide material Oxide2 and the third oxide material Oxide3 may be set as: $|E_{CBM}$Oxide3$|>|E_{CBM}$Oxide2$|$.

Figure 7:
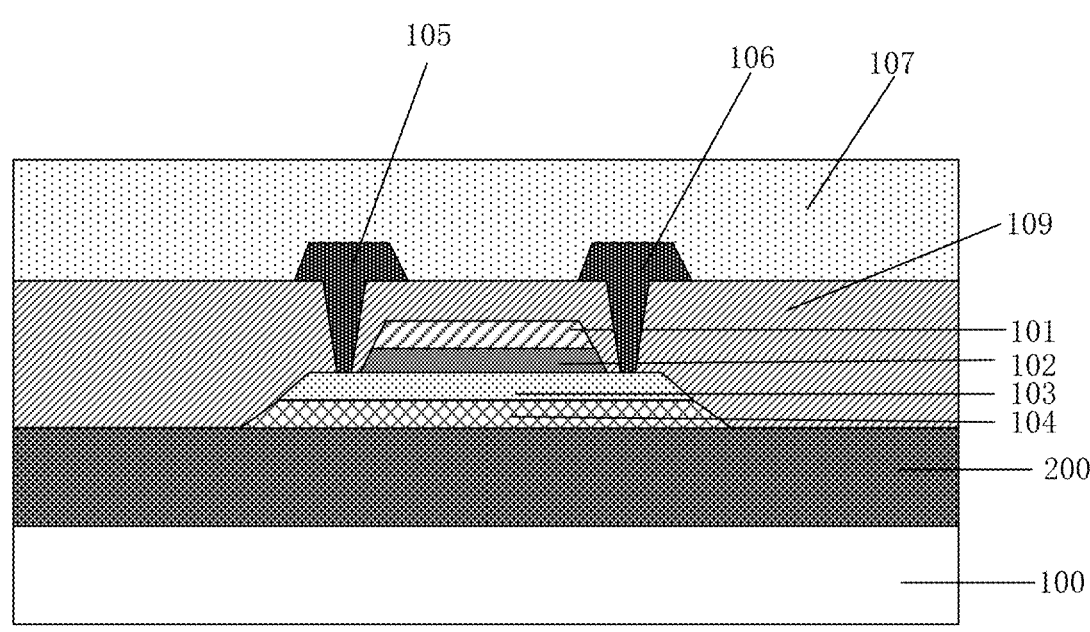
FIG. 7 shows a schematic diagram of a structure of a thin film transistor according to an embodiment of the present disclosure.

In the above embodiments, the present disclosure is described with the thin film transistor being a bottom gate type transistor, but the present disclosure is not limited thereto. FIG. 7 shows a schematic diagram of a structure of a thin film transistor which is a top gate type thin film transistor according to an embodiment of the present disclosure.

The thin film transistor shown in FIG. 7 includes a substrate 100 made of, for example, glass; and a buffer layer 200, a second semiconductor layer 104, a first semiconductor layer 103, a gate insulating layer 102, a gate electrode 101, an interlayer dielectric layer 109, a source electrode 105, a drain electrode 106, and a passivation layer 107 sequentially formed on the substrate 100.

In the top gate type thin film transistor, similarly to the embodiment shown in FIG. 2, the active layer includes the first semiconductor layer 103 and the second semiconductor layer 104. The second semiconductor layer 104 is provided on a side of the first semiconductor layer 103 away from the gate electrode 101. As in the embodiment shown in FIG. 2, the first semiconductor layer 103, as a portion of the active layer mainly for forming a channel carrying carriers to turn on the thin film transistor, is generally made of an oxide material having a high mobility, and is provided between the gate insulating layer 102 and the second semiconductor layer 104. For example, the first semiconductor layer 103 may be formed by using IGZO having a conduction band minimum $E_{CBM}$ in a range from 4.4 eV to 5.2 eV, a band gap Eg in a range from 2.0 eV to 3.2 eV, and a carrier concentration in an order of 5*E19. The second semiconductor layer 104 is provided on a side of the first semiconductor layer 103 away from the gate electrode 101. In the thin film transistor of the present embodiment, as described above, it is desirable that carriers are in the first semiconductor layer 103 so that the carriers are transmitted between the source electrode 105 and the drain electrode 106 by using the first semiconductor layer 103 as a channel layer when the thin film transistor operates; while a main function of the second semiconductor layer 104 includes interface matching and etch protection, thus acting as an etch stop layer.

Specifically, in the present disclosure, an absolute value of a difference between a conduction band minimum of the first material of the first semiconductor layer 103 and a conduction band minimum of the second material of the second semiconductor layer 104 is greater than 0.2 eV.

In one embodiment, the first semiconductor layer 103 and the second semiconductor layer 104 are both oxide semiconductor layers. The first oxide material Oxide1 of the first semiconductor layer 103 and the second oxide material Oxide2 of the second semiconductor layer 104 should satisfy an absolute value of $(E_{CBM}$Oxide1$-E_{CBM}$Oxide2$)$ being greater than 0.2 eV, and the absolute value further may be greater than 0.3 eV.

The material of the first semiconductor layer 103 may be IGZO, which is a material of a semiconductor layer in the related art; and the material of the second semiconductor layer 104 may be GZO, which mainly functions as the etch stop layer. In this case, it is ensured that the absolute value of $(E_{CBM}$Oxide1$-E_{CBM}$Oxide2$)$ is greater than 0.4 eV, so that most of carriers in the first semiconductor layer 103 are blocked and cannot migrate to the back channel and thus, cannot be captured by the back channel, thereby improving the stability of the thin film transistor.

Specifically, the material of the first semiconductor layer 103 may include at least one of IGZO, IZO, IGTO, and IGZTO, which all have a higher electron mobility; the material of the second semiconductor layer 104 may include at least one of GZO and Pr-GZO (where GZO is doped with a certain amount of Pr (praseodymium element)), which all have a higher conduction band minimum. Specifically, the conduction band minimums $E_{CBM}$ of these materials are as follows: IGZO (111)=4.48 eV; IZO (31)=5.2 eV; IZO (11) =4.9 eV; GZO (73)=4.05 eV; GZO (37)=4.08 eV.

In the embodiment, the source electrode 105 and the drain electrode 106 are electrically connected to both ends of the first semiconductor layer 103, which are not covered by the gate electrode 101 and the gate insulating layer 102, respectively, through two vias extending through the interlayer dielectric layer 109. In the embodiment, patterns of the second semiconductor layer 104 and the first semiconductor layer 103 may be simultaneously formed by using a single patterning process. For example, the second oxide material layer and the first oxide material layer may be sequentially formed on the buffer layer 200 on the substrate 100, and then the patterns of the second semiconductor layer 104 and the first semiconductor layer 103 may be simultaneously formed through the same patterning process (including coating photoresist, exposure, development, etching) by using a same mask. In this way, orthographic projections of the patterns of the first semiconductor layer 103 and the second semiconductor layer 104 on the substrate 100 substantially completely overlap each other. Similarly, patterns of the gate electrode 101 and the gate insulating layer 102 may also be simultaneously formed through the same patterning process by using a same mask.

Figure 8:
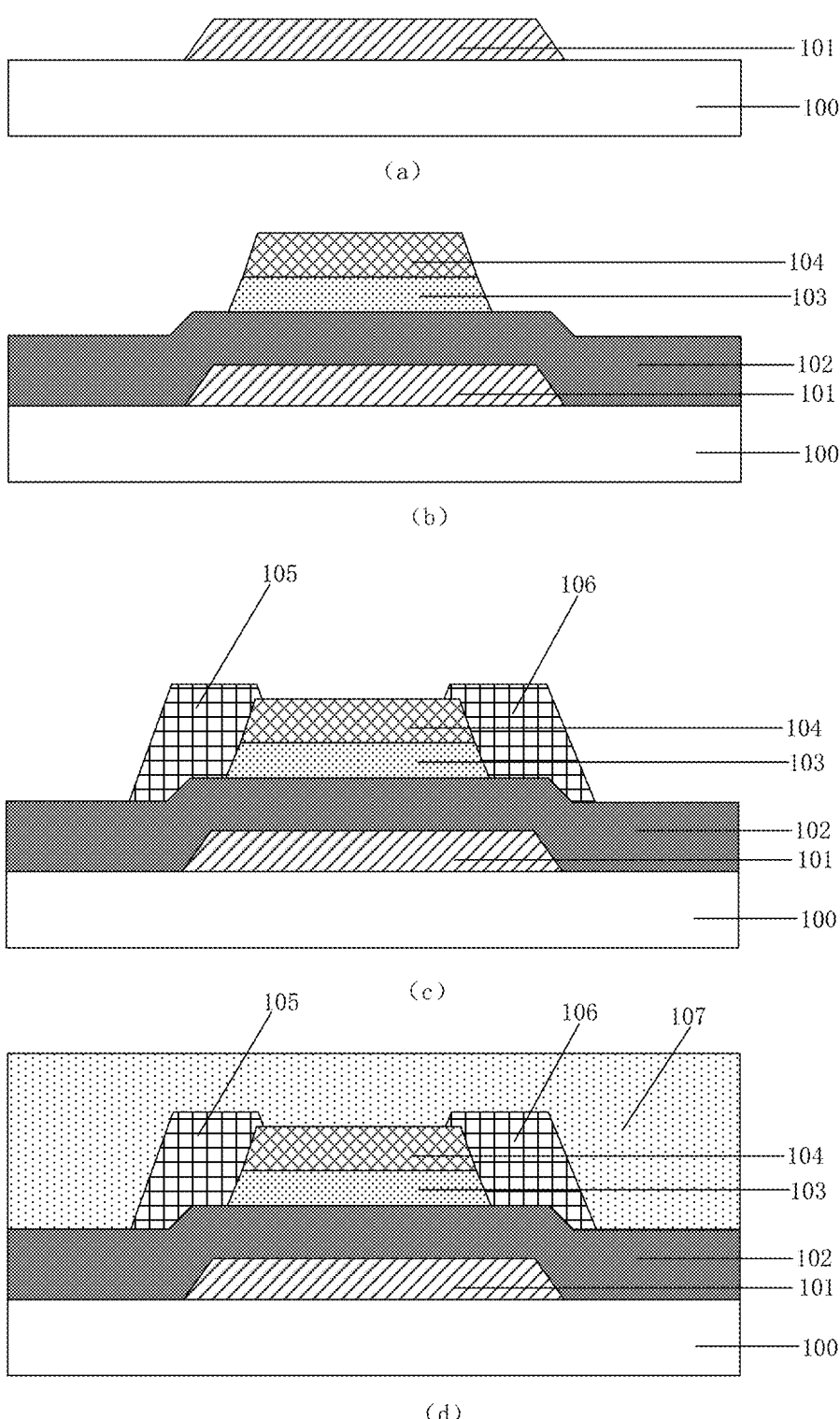
FIG. 8 shows a schematic diagram of a procedure for manufacturing a thin film transistor according to an embodiment of the present disclosure.

Another aspect of the present disclosure also provides a method for manufacturing a thin film transistor. FIG. 8 shows a procedure illustrating structures formed in various steps of a method for manufacturing a thin film transistor according to the present disclosure. Specifically, as shown in FIG. 9, the flow chart of the method for manufacturing a thin film transistor of the present disclosure includes steps S101 to S104.

In step S101, as shown in FIG. 8(*a*), a pattern of a gate electrode 101 is formed on a substrate 100, for example, made of glass; a gate insulating layer 102 is then formed on the formed pattern of the gate electrode 101.

In step S102, as shown in FIG. 8(*b*), patterns of a first semiconductor layer 103 and a second semiconductor layer 104 are formed on the gate insulating layer 102. For example, firstly, a first oxide material layer and a second oxide material layer are sequentially formed on the gate insulating layer 102, and then the patterns of the first semiconductor layer 103 and the second semiconductor layer 104 are simultaneously formed through a same patterning process by using a same mask. Specifically, for example, a photoresist is coated on the second oxide material layer, and then is exposed, developed, and etched, to simultaneously form the first semiconductor layer 103 and the second semiconductor layer 104, which is not limited in the present disclosure, as long as the first oxide material Oxide1 of the first semiconductor layer 103 and the second oxide material Oxide2 of the second semiconductor layer 104 are formed to satisfy an absolute value of ($E_{CBM}$Oxide1−$E_{CBM}$Oxide2) is greater than 0.2 eV. In this way, most of carriers in the first semiconductor layer 103 are blocked and cannot migrate to the back channel and thus, cannot be captured by the back channel, thereby improving the stability of the thin film transistor. In this step, patterns of the first semiconductor layer 103 and the second semiconductor layer 104 are simultaneously formed through the same patterning process by using the same mask, which can improve the stability of the device without adding a mask.

As described above, the material of the first semiconductor layer 103 may include at least one of IGZO, IZO, IGTO, and IGZTO, which all have a high electron mobility; the material of the second semiconductor layer 104 may include at least one of GZO and Pr-GZO (where GZO is doped with a certain amount of Pr (praseodymium element)), which all have a high conduction band minimum. Specifically, the conduction band minimums $E_{CBM}$ of these materials are as follows: IGZO (111)=4.48 eV; IZO (31)=5.2 eV; IZO (11)= 4.9 eV; GZO (73)=4.05 eV; GZO (37)=4.08 eV.

In step S103, a source-drain material layer is formed on the patterns of the first semiconductor layer 103 and the second semiconductor layer 104 on the gate insulating layer 102, and a wet etching is performed on the source-drain material layer by using an etching solution to form a source electrode 105 and a drain electrode 106 on both sides of the first semiconductor layer 103, respectively. The second semiconductor layer 104 serving as an etch stop layer can prevent the material of the first semiconductor layer 103 from being damaged by the etching solution in this step.

As shown in FIG. 8(c), the source electrode 105 and the drain electrode 106 formed in the step cover both ends of each of the first semiconductor layer 103 and the second semiconductor layer 104. However, as described above, in the present disclosure, when the thin film transistor operates, only the first semiconductor layer 103 serves as an effective carrier channel to turn on the thin film transistor; while the second semiconductor layer 104 mainly serves as an etch stop layer and functions as interface matching to confine effective carriers in the first semiconductor layer 103 as much as possible and block the carriers from migrating to the second semiconductor layer 104.

In step S104, a passivation layer 107 is formed on the formed structure to protect the thin film transistor.

In one embodiment of the present disclosure, for the thin film transistor where the active layer includes the first semiconductor layer 103, the second semiconductor layer 104, and the third semiconductor layer 108 as shown in FIG. 6, the manufacturing method includes steps S201 to S204.

In step S201, a pattern of a gate electrode 101 is formed on a substrate 100, for example, made of glass; a gate insulating layer 102 is then formed on the formed pattern of the gate electrode 101.

In step S202, patterns of a first semiconductor layer 103, a second semiconductor layer 104 and a third semiconductor layer 108 are formed on the gate insulating layer 102. For example, firstly, a first oxide material layer, a second oxide material layer and a third oxide material layer are sequentially formed on the gate insulating layer 102, and then the patterns of the first semiconductor layer 103, the second semiconductor layer 104 and the third semiconductor layer 108 are simultaneously formed through a same patterning process by using a same mask. Specifically, for example, a photoresist is coated on the third oxide material layer, and then is exposed, developed, and etched, to simultaneously form the first semiconductor layer 103, the second semiconductor layer 104 and the third semiconductor layer 108. As described above, a material of the third semiconductor layer 108 may be a third oxide material Oxide3. For example, the third oxide material may be a crystalline oxide material, such as IGZO (136) or the like. In the embodiment, a relationship of the energy levels of the conduction band minimums $E_{CBM}$ of the first oxide material Oxide1, the second oxide material Oxide2 and the third oxide material Oxide3 of the active layer may be set as: |$E_{CBM}$Oxide1− $E_{CBM}$Oxide2|>0.2 eV; further, may be set as |$E_{CBM}$Oxide1− $E_{CBM}$Oxide2|>0.3 eV, to further improve the performance of the thin film transistor; a relationship of energy levels of the conduction band minimums of the second oxide material Oxide2 and the third oxide material Oxide3 may be set as: |$E_{CBM}$Oxide3|>|$E_{CBM}$Oxide2|. In this way, most of carriers in the first semiconductor layer 103 are blocked and cannot migrate to the back channel and thus, cannot be captured by the back channel, thereby improving the stability of the thin film transistor. In this step, patterns of the first semiconductor layer 103, the second semiconductor layer 104 and the third semiconductor layer 108 are simultaneously formed through the same patterning process by using the same mask, which can improve the stability of the device without adding a mask.

In step S203, a source-drain material layer is formed on the patterns of the first semiconductor layer 103, the second semiconductor layer 104 and the third semiconductor layer 108 on the gate insulating layer 102, and a wet etching is performed on the source-drain material layer by using an etching solution to form a source electrode 105 and a drain electrode 106 on both sides of the first semiconductor layer 103, respectively. The second semiconductor layer 104 serving as an etch stop layer can prevent the material of the first semiconductor layer 103 from being damaged by the etching solution in this step.

In step S204, a passivation layer 107 is formed on the formed structure to protect the thin film transistor.

In one embodiment of the present disclosure, for the top gate type thin film transistor shown in FIG. 7 where the active layer includes the first semiconductor layer 103 and the second semiconductor layer 104, the manufacturing method includes steps S301 to S305.

In step S301, a buffer layer 200, a second material layer, a first material layer, a gate insulating material layer, and a gate material layer are sequentially formed on a substrate 100; patterns of a gate electrode 101 and a gate insulating layer 102 are formed through a same patterning process by using a same first mask; a first semiconductor layer 103 and a second semiconductor layer 104 are then formed through a same patterning process by using a same second mask. As shown in FIG. 7, in order to leave places to contact a source electrode 105 and a drain electrode 106, an area of an orthographic projection of each of the first semiconductor layer 103 and the second semiconductor layer 104 on the substrate 100 is greater than that of an orthographic projection of each of the gate electrode 101 and the gate insulating layer 102 on the substrate 100.

In step S302, an interlayer dielectric layer 109 is formed on a side of the gate electrode 101 away from the substrate 100.

In step S303, a first via and a second via are formed at positions corresponding to both ends of the first semiconductor layer 103 in the interlayer dielectric layer 109, respectively.

In step S304, a source material and a drain material are filled in the first via and the second via, respectively, thereby forming the source electrode and the drain electrode, respectively.

In step S305, a passivation layer is formed on the source electrode and the drain electrode.

In the thin film transistor of the present disclosure, the active layer includes the first semiconductor layer 103 and the second semiconductor layer 104, both of which are oxide semiconductor layers. The first oxide material Oxide1 of the first semiconductor layer 103 and the second oxide material Oxide2 of the second semiconductor layer 104 should satisfy an absolute value of $(E_{CBM}\text{Oxide1}-E_{CBM}\text{Oxide2})$ being greater than 0.2 eV, and the absolute value further may be greater than 0.3 eV. The material of the first semiconductor layer 103 may be IGZO, which is a material of a semiconductor layer in the related art; and the material of the second semiconductor layer 104 may be GZO, which mainly functions as the etch stop layer. In this case, it is ensured that the absolute value of $(E_{CBM}\text{Oxide1}-E_{CBM}\text{Oxide2})$ is greater than 0.4 eV, so that most of carriers in the first semiconductor layer 103 are blocked and cannot migrate to the back channel and thus, cannot be captured by the back channel, thereby improving the stability of the thin film transistor.

The embodiment of the present disclosure further provides an array substrate, which includes the thin film transistor.

Specifically, the array substrate includes a driving circuit to drive the light emitting device. The driving circuit may include a plurality of thin film transistors, for example, a switching transistor, a driving transistor, or the like, at least one of which may be the thin film transistor provided in the embodiment of the present disclosure.

The embodiment of the present disclosure further provides a display panel, including the above array substrate.

Optionally, the display panel may include various types of display panels, such as a liquid crystal display panel, an active-matrix organic light emitting diode (AMOLED) display panel, a passive matrix organic light emitting diode (PMOLED) display panel, or a micro light emitting diode (micro LED) display panel.

Although the embodiments of the present application are described above, the described contents are implementations only used for the purpose of facilitating understanding of the present application, and are not intended to limit the present application. A person skilled in the art may make various changes and modifications in form and details of the implementation without departing from the spirit and scope of the present disclosure, but the protection scope of the present disclosure is still defined by the appended claims.

What is claimed is:

1. A thin film transistor, comprising:
a substrate; and
a gate electrode, a gate insulating layer, an active layer, a source electrode and a drain electrode on the substrate, wherein the active layer comprises a first semiconductor layer and a second semiconductor layer sequentially arranged in a direction perpendicular to the substrate,
the second semiconductor layer is arranged on a side of the first semiconductor layer away from the gate electrode;
the first semiconductor layer comprises a first oxide material, and the second semiconductor layer comprises a second oxide material;
the first oxide material has an electron mobility higher than that of the second oxide material; and
the first oxide material has a conduction band minimum lower than that of the second oxide material, and an absolute value of a difference between the conduction band minimum of the first oxide material and the conduction band minimum of the second oxide material is greater than 0.2 eV,
wherein the active layer further comprises a third semiconductor layer on a side of the second semiconductor layer away from the gate electrode;
the third semiconductor layer comprises a crystalline oxide material;
an absolute value of a conduction band minimum of the crystalline oxide material is greater than that of the conduction band minimum of the second oxide material; and
the crystalline oxide material comprises crystalline IGZO (136) with an atomic ratio of In:Ga:Zn being 1:3:6 to improve physical blocking characteristics for preventing H and O elements in its adjacent layer from affecting the active layer.

2. The thin film transistor of claim 1, wherein
the active layer further comprises a fourth semiconductor layer on a side of the first semiconductor layer close to the gate electrode;
the fourth semiconductor layer comprises a fourth oxide material; and
the fourth oxide material has an electron mobility less than that of the first oxide material.

3. The thin film transistor of claim 2, wherein
the fourth oxide material and the second oxide material are a same material.

4. The thin film transistor of claim 3, wherein
the first oxide material comprises at least one of IGZO, IZO, IGTO, ITZO, and IGZTO; and
the second oxide material comprises at least one of GZO and Pr-GZO, where Pr-GZO is GZO doped with praseodymium element, and GZO is GZO (73) with an atomic ratio of Ga:Zn being 7:3 or GZO (37) with an atomic ratio of Ga:Zn being 3:7.

5. The thin film transistor of claim 4, wherein
the gate insulating layer is on a side of the gate electrode away from the substrate;
the active layer is on a side of the gate insulating layer away from the substrate;
areas of orthographic projections of the first semiconductor layer and the second semiconductor layer on the substrate are substantially the same; and
the source electrode and the drain electrode are in contact with two opposite ends of each of the first semiconductor layer and the second semiconductor layer on the gate insulating layer, respectively.

6. The thin film transistor of claim 4, further comprising a buffer layer and an interlayer dielectric layer on the substrate, wherein
the second semiconductor layer is on a side of the buffer layer away from the substrate;

the first semiconductor layer is on a side of the second semiconductor layer away from the substrate;

the gate insulating layer is on a side of the first semiconductor layer away from the substrate;

the gate electrode is on a side of the gate insulating layer away from the substrate;

the interlayer dielectric layer is on a side of the gate electrode away from the substrate;

areas of orthographic projections of the first semiconductor layer and the second semiconductor layer on the substrate are substantially the same; and the source electrode and the drain electrode are in contact with two opposite ends of the first semiconductor layer through a first via and a second via in the interlayer dielectric layer, respectively.

7. An array substrate, comprising a light emitting device and a driving circuit for driving the light emitting device to emit light, wherein the driving circuit comprises the thin film transistor of claim 1.

8. A display panel, comprising the array substrate of claim 7.

9. The thin film transistor of claim 1, wherein the first oxide material comprises at least one of IGZO, IZO, IGTO, ITZO, and IGZTO; and the second oxide material comprises at least one of GZO and Pr-GZO, where Pr-GZO is GZO doped with praseodymium element, and GZO is GZO (73) with an atomic ratio of Ga:Zn being 7:3 or GZO (37) with an atomic ratio of Ga:Zn being 3:7.

10. A method for manufacturing a thin film transistor, comprising:

forming a gate electrode, a gate insulating layer, an active layer, a source electrode and a drain electrode on a substrate, wherein the active layer comprises a first semiconductor layer and a second semiconductor layer sequentially arranged in a direction perpendicular to the substrate, the second semiconductor layer is arranged on a side of the first semiconductor layer away from the gate electrode;

the first semiconductor layer comprises a first oxide material, and the second semiconductor layer comprises a second oxide material;

the first oxide material has an electron mobility higher than that of the second oxide material; and the first oxide material has a conduction band minimum lower than that of the second oxide material, and an absolute value of a difference between the conduction band minimum of the first oxide material and the conduction band minimum of the second oxide material is greater than 0.2 eV, wherein the active layer further comprises a third semiconductor layer on a side of the second semiconductor layer away from the gate electrode;

the third semiconductor layer comprises a crystalline oxide material; and an absolute value of a conduction band minimum of the crystalline oxide material is greater than that of the conduction band minimum of the second oxide material; and the crystalline oxide material comprises crystalline IGZO (136) with an atomic ratio of In:Ga:Zn being 1:3:6 to improve physical blocking characteristics for preventing H and O elements in its adjacent layer from affecting the active layer.

11. The method of claim 10, wherein the first oxide material comprises at least one of IGZO, ITZO, IZO, IGTO, and IGZTO; and the second oxide material comprises at least one of GZO and Pr-GZO, where Pr-GZO is GZO doped with praseodymium element, and GZO is GZO (73) with an atomic ratio of Ga:Zn being 7:3 or GZO (37) with an atomic ratio of Ga:Zn being 3:7.

12. The method of claim 11, wherein the forming a gate electrode, a gate insulating layer, an active layer, a source electrode and a drain electrode on a substrate, comprises:

forming a pattern of the gate electrode on the substrate;

forming the gate insulating layer on the pattern of the gate electrode;

sequentially forming a first oxide material layer and a second oxide material layer on the gate insulating layer, and forming patterns of the first semiconductor layer and the second semiconductor layer on the gate insulating layer by one patterning process with a first mask;

forming a source-drain material layer on the patterns of the first semiconductor layer and the second semiconductor layer on the gate insulating layer, and etching the source-drain material layer to form the source electrode and the drain electrode at two opposite ends of the first semiconductor layer, respectively; and forming a passivation layer on the source electrode and the drain electrode.

13. The method of claim 11, wherein the forming a gate electrode, a gate insulating layer, an active layer, a source electrode and a drain electrode on a substrate, comprises:

forming a pattern of the gate electrode on the substrate;

forming the gate insulating layer on the pattern of the gate electrode;

sequentially forming a first oxide material layer, a second oxide material layer and a third oxide material layer on the gate insulating layer, and forming patterns of the first semiconductor layer, the second semiconductor layer and a third semiconductor layer on the gate insulating layer by one patterning process with a first mask;

forming a source-drain material layer on the patterns of the first semiconductor layer, the second semiconductor layer and the third semiconductor layer on the gate insulating layer, and etching the source-drain material layer to form the source electrode and the drain electrode at two opposite ends of the first semiconductor layer, respectively; and forming a passivation layer on the source electrode and the drain electrode.

14. The method of claim 11, wherein the forming a gate electrode, a gate insulating layer, an active layer, a source electrode and a drain electrode on a substrate, comprises:

sequentially forming a buffer layer, a second oxide material layer, a first oxide material layer, a gate insulating material layer and a gate material layer on the substrate;

forming patterns of the gate electrode and the gate insulating layer by one patterning process with a first mask;

forming patterns of the first semiconductor layer and the second semiconductor layer by one patterning process with a second mask;

forming an interlayer dielectric layer on a side of the gate electrode away from the substrate;

forming a first via and a second via in the interlayer dielectric layer at positions corresponding to two opposite ends of the first semiconductor layer, respectively;

filling a source material and a drain material in the first via and the second via, respectively, to form the source electrode and the drain electrode; and forming a passivation layer on the source electrode and the drain electrode.

15. The method of claim 11, wherein the forming a gate electrode, a gate insulating layer, an active layer, a source electrode and a drain electrode on a substrate, comprises:

forming a pattern of the gate electrode on the substrate;

forming a gate insulating layer on the pattern of the gate electrode;

sequentially forming a fourth oxide material layer, a first oxide material layer and a second oxide material layer on the gate insulating layer, and forming patterns of a fourth semiconductor layer, the first semiconductor layer and the second semiconductor layer on the gate insulating layer by one patterning process with a first mask;

forming a source-drain material layer on the patterns of the fourth semiconductor layer, the first semiconductor layer and the second semiconductor layer on the gate insulating layer, and etching the source-drain material layer to form the source electrode and the drain electrode at two opposite ends of the first semiconductor layer, respectively; and forming a passivation layer on the source electrode and the drain electrode.

16. The method of claim 10, wherein the forming a gate electrode, a gate insulating layer, an active layer, a source electrode and a drain electrode on a substrate, comprises:

forming a pattern of the gate electrode on the substrate;

forming a gate insulating layer on the pattern of the gate electrode;

sequentially forming a fourth oxide material layer, a first oxide material layer and a second oxide material layer on the gate insulating layer, and forming patterns of a fourth semiconductor layer, the first semiconductor layer and the second semiconductor layer on the gate insulating layer by one patterning process with a first mask;

forming a source-drain material layer on the patterns of the fourth semiconductor layer, the first semiconductor layer and the second semiconductor layer on the gate insulating layer, and etching the source-drain material layer to form the source electrode and the drain electrode at two opposite ends of the first semiconductor layer, respectively; and forming a passivation layer on the source electrode and the drain electrode.

* * * * *